(12) United States Patent
Stark et al.

(10) Patent No.: US 6,208,514 B1
(45) Date of Patent: Mar. 27, 2001

(54) MECHANICAL LATCH FOR AN ELECTRONIC CARTRIDGE

(75) Inventors: Michael Stark, Tempe; Michael Rutigliano, Chandler, both of AZ (US); Bill Lieska, Shelton; Peter A. Davison, Sumner, both of WA (US); James S. Webb, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/024,861

(22) Filed: Feb. 17, 1998

(51) Int. Cl.[7] ....................................................... H05K 7/20
(52) U.S. Cl. .......................... 361/704; 361/740; 361/754; 361/759; 361/802; 361/818; 439/327; 211/41.17; 174/35 GC; 29/842
(58) Field of Search ..................................... 361/683, 684, 361/687, 690–698, 703–720, 752, 759, 772, 801, 818, 704, 740, 754, 802; 257/718, 722; 165/803, 804, 185; 439/152, 326–328, 157, 320; 403/16; 211/41.17; 174/16.3, 35 R, 51, 35 GC; 29/840, 842

(56) References Cited

U.S. PATENT DOCUMENTS

| | | | |
|---|---|---|---|
| 4,917,618 | * | 4/1990 | Behrens et al. ...................... 439/157 |
| 5,829,601 | * | 11/1998 | Yurchenco et al. ............... 211/41.17 |

\* cited by examiner

Primary Examiner—Leo P. Picard
Assistant Examiner—Michael Datskovsky
(74) Attorney, Agent, or Firm—Blakely, Sokoloff, Taylor & Zafman LLP

(57) ABSTRACT

An electronic cartridge which may include an integrated circuit package that is mounted to a substrate. The substrate may include a plurality of conductive pads that are inserted into an electrical connector. The cartridge may be guided into the connector by a guide rail which has a latch slot. The electronic cartridge may include a latch which extends from a cover that is coupled to the substrate. The latch may extend into the latch slot to secure the cartridge to the connector.

9 Claims, 2 Drawing Sheets

MECHANICAL LATCH FOR AN ELECTRONIC CARTRIDGE

BACKGROUND OF THE INVENTION

1. Field of the Invention

The present invention relates to a retention latch which secures an electronic cartridge to a guide rail of an electrical assembly.

2. Background Information

Integrated circuits are typically assembled into packages that are mounted to a printed circuit board. The circuit board may be plugged into a connector which is mounted to a motherboard of a computer system. The computer system may be subjected to external shock and vibration loads. Shock and vibration loads may decouple the circuit board from the connector. It would be desirable to provide a latching device which secures the board to the connector.

SUMMARY OF THE INVENTION

One embodiment of the present invention is an electronic cartridge which has a latch. The latch extends from a cover that is coupled to a substrate. The substrate may support an integrated circuit package.

DETAILED DESCRIPTION OF THE INVENTION

One embodiment of the present invention is an electronic cartridge which may include an integrated circuit package that is mounted to a substrate. The substrate may include a plurality of conductive pads that are inserted into an electrical connector. The cartridge may be guided into the connector by a guide rail which has a latch slot. The electronic cartridge may include a latch which extends from a cover that is coupled to the substrate. The latch may extend into the latch slot to secure the cartridge to the connector.

Figure 1:
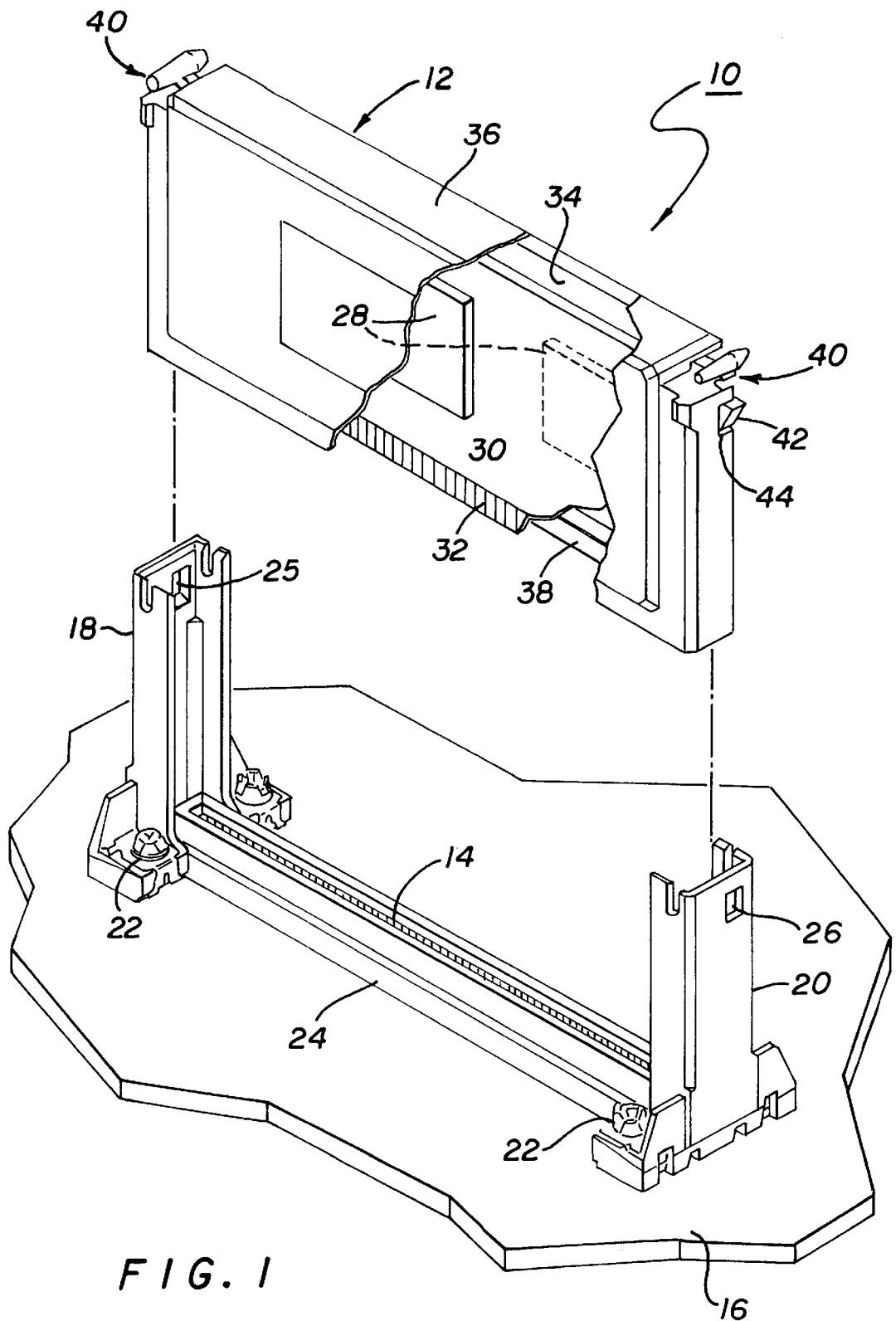
FIG. 1 is a perspective view of an embodiment of an electrical system of the present invention.

Referring to the drawings more particularly by reference numbers, FIG. 1 shows an embodiment of an electrical assembly 10 of the present invention. The assembly 10 may include an electronic cartridge 12 that can be plugged into an electrical connector 14. The connector 14 can be mounted to a motherboard 16 of a computer system (not shown).

The assembly 10 may also include a first guide rail 18 and a second guide rail 20 that are mounted to the motherboard 16 by fasteners 22. The guide rails 18 and 20 may be joined together by a pair of beams 24 which extend along the sides of the connector 14. The beams 22 and guide rails 18 and 20 may be constructed as one molded plastic piece. The first guide rail 18 may have a first latch slot 25. The second guide rail 20 may have a second latch slot 26.

The electronic cartridge 12 may include one or more integrated circuit packages 28 that are mounted to a substrate 30. The packages 28 may contain integrated circuits (not shown) such as microprocessors, memory, etc. The substrate 30 may be a printed circuit board which has surface pads, routing traces, power/ground planes, vias, etc. as is known in the art. One edge of the substrate 30 may have a plurality of conductive pads 32 that can be inserted into the connector 14.

The cartridge 12 may have a thermal plate 34 that is attached to the substrate 30 and thermally coupled to one or more of the packages 28. The cartridge 12 may also have a cover 36 that is attached to the thermal plate 34. The cover 36 and plate 34 may enclose the integrated circuit packages 28. To minimize the weight of the cartridge 12, the thermal plate 34 may extend only over the area that contains the integrated circuit packages 28. A shield 38 may be incorporated into the cartridge 12 to inhibit human contact with the conductive pads 32. The electronic cartridge 12 may include a pair of latches 40.

Figure 2:
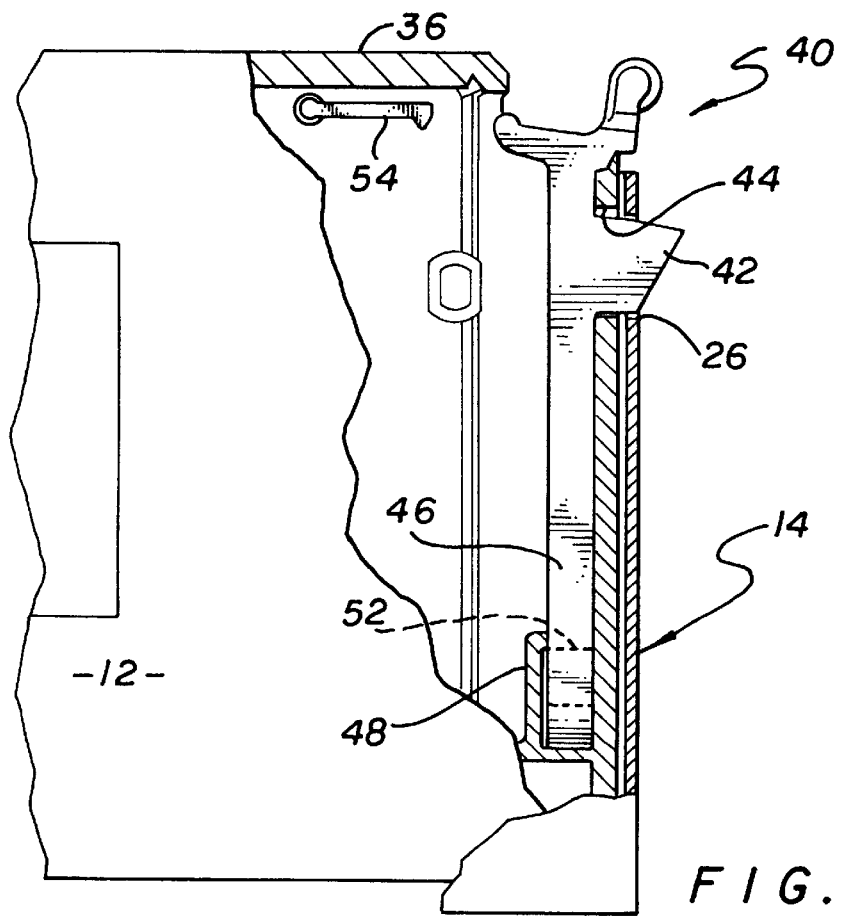
FIG. 2 is a front sectional view showing a latch inserted into a guide rail of the electrical system.

As shown in FIG. 2, each latch 40 may have a tab 42 that extends through an opening 44 in the cover 36 and into the latch slot 26 when the cartridge 12 is plugged into the connector 14. The inserted tabs 42 prevent the cartridge 12 from being pulled out of the connector 14. The latches 40 may each have a stem 46 that is inserted into an alignment box 48 formed in the cover 36. The alignment box 48 supports and aligns the latch 40 within the cover 36 so that the tab 42 extends into the slot 26 of the guide rail 20 when the cartridge 12 is plugged into the connector 14.

Figure 3:
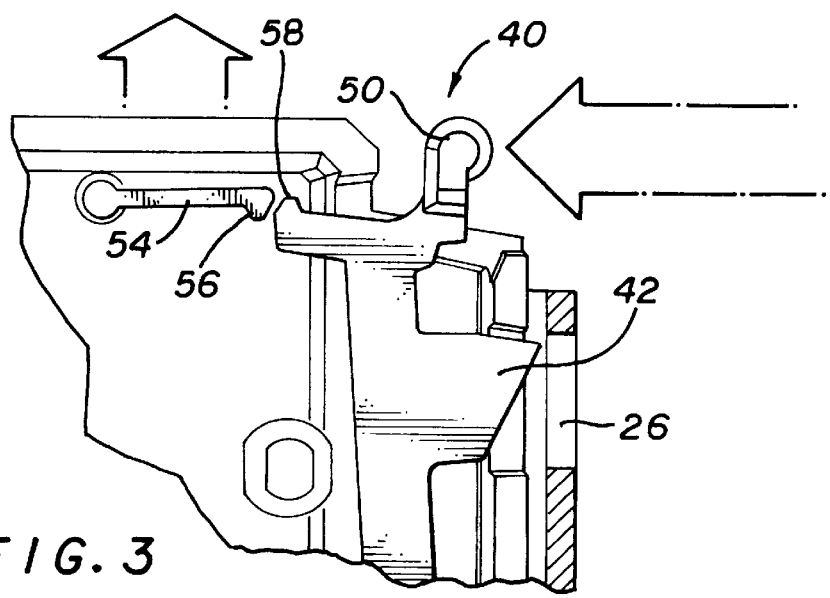
FIG. 3 is an enlarged sectional view showing the latch disengaged from the guide rail.

As shown in FIG. 3, each latch 40 may have a lever 50 that can be depressed to move the tab 42 out of the latch slot 26 and into a disengaged position. Each latch 40 can pivot about a protrusion 52 in the stem 46 shown in FIG. 2. The cartridge 12 can be pulled out of the connector 14 when the latches 40 are in the disengaged position.

Referring to FIG. 3, each side of the cover 36 may have a detent 54 which each have a lip 56 that cooperates with a latch lip 58 to secure the latch 40 in the disengaged position. The latches 40 can be separated from the detents 54 by pulling the levers 50 in an outward direction. The latches 40 can each be constructed as an integrally molded part.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic cartridge, comprising:
   a substrate;
   an integrated circuit package mounted to said substrate;
   a cover coupled to said substrate, said cover having an alignment box; and,
   a latch which extends into said alignment box and extends from said cover.

2. The cartridge as recited in claim 1, wherein said latch includes a lever that can be depressed to move said latch to a disengaged position.

3. The cartridge as recited in claim 2, further comprising a detent that holds said latch in said disengaged position.

4. The cartridge as recited in claim 1, wherein said latch pivots about said cover.

5. The cartridge as recited in claim 1, wherein an edge of said substrate has a conductive pad.

6. The cartridge as recited in claim 1, further comprising a thermal plate that is attached to said substrate and said cover.

7. An electrical assembly, comprising:
   a motherboard;
   a connector mounted to said motherboard;
   a guide rail mounted to said motherboard adjacent to said connector, said guide rail having a latch slot; and,
   an electronic cartridge that is plugged into said connector, said electronic cartridge having a latch that extends from a cover and into said latch slot, said latch also extends into an alignment box of said cover.

8. The assembly as recited in claim 7, wherein said latch includes a lever that can be depressed to move said latch out of said latch slot and into a disengaged position.

9. The assembly as recited in claim 8, wherein said electronic cartridge includes a detent that holds said latch in said disengaged position.

* * * * *